United States Patent
Reisgen et al.

(10) Patent No.: US 9,347,974 B2
(45) Date of Patent: May 24, 2016

(54) METHOD FOR DETERMINING BEAM PARAMETERS OF A CHARGE CARRIER BEAM, MEASURING DEVICE, AND CHARGE CARRIER BEAM DEVICE

(71) Applicants: RWTH Aachen Koerperschaft des oeffentlichen Rechts, Aachen (DE); aixACCT Systems GmbH, Aachen (DE)

(72) Inventors: Uwe Reisgen, Eschweller (DE); Jens De Vries, Eschweller (DE); Alexander Backhaus, Aachen (DE); Hans-Peter Bauer, Eynatten (BE); Sebastian Ufer, Aachen (DE); Bernd Reichenberg, Wuerselen (DE); Thorsten Schmitz-Kempen, Aachen (DE)

(73) Assignees: RWTH AACHEN KOERPERSCHAFT DES OEFFENTLICHEN RECHTS (DE); AIXACCT SYSTEMS GmbH (DE)

( * ) Notice: Subject to any disclaimer, the term of this patent is extended or adjusted under 35 U.S.C. 154(b) by 68 days.

(21) Appl. No.: 13/261,962

(22) PCT Filed: Mar. 11, 2013

(86) PCT No.: PCT/DE2013/100091
§ 371 (c)(1),
(2) Date: Sep. 29, 2014

(87) PCT Pub. No.: WO2013/143531
PCT Pub. Date: Oct. 3, 2013

(65) Prior Publication Data
US 2015/0083928 A1    Mar. 26, 2015

(30) Foreign Application Priority Data
Mar. 27, 2012    (DE) .......................... 10 2012 102 608

(51) Int. Cl.
*G01R 19/00*    (2006.01)
*G21K 1/04*    (2006.01)
(Continued)

(52) U.S. Cl.
CPC ........ *G01R 19/0061* (2013.01); *B23K 15/0013* (2013.01); *B23K 15/0026* (2013.01);
(Continued)

(58) Field of Classification Search
CPC .............. G01M 11/00; B23K 15/0013; B23K 15/0026; G21K 1/04; H01J 37/244; H01J 37/3007; H01J 37/3053; H01J 37/31; H01J 37/315; H01J 2237/24514; H01J 2237/24542; H01J 2237/303; G01R 19/0061
See application file for complete search history.

(56) References Cited

U.S. PATENT DOCUMENTS 4,164,640 A    8/1979    Scheffels
5,382,895 A    1/1995    Elmer et al.
(Continued)

FOREIGN PATENT DOCUMENTS

DE    206960    2/1984
DE    226428    8/1985

OTHER PUBLICATIONS

U. Dilthey et al.; Electron beam diagnostics: a new release of the diabeam system. In: Vacuum, 62, 2001, 77-85.
(Continued)

*Primary Examiner* — Jack Berman
(74) *Attorney, Agent, or Firm* — David C. Purdue

(57) ABSTRACT

The application relates to a method for determining beam parameters of a charge carrier beam, a measuring device, and a charge carrier beam device. The charge carrier beam (4) from a charge carrier beam device (1) is guided, by means of a beam deflection unit (3), over a slit aperture arrangement which is provided in an aperture device (7) and which has one or more slit apertures (8). Measurement plane coordinates of the beam components that penetrate the slit aperture arrangement are determined. On the basis of the measurement plane coordinates, the aperture device automatically moves in such a way that a measuring aperture (9) arranged in the aperture device moves over a predefined measurement reference point. The beam parameter is measured by the measuring aperture. In a measuring device (5) suitable for carrying out said method, the slit aperture arrangement has at least two non-parallel slit aperture sections (12, 13, 15, 16) which can be part of a single continuous slit aperture.

20 Claims, 2 Drawing Sheets

Figure 1:
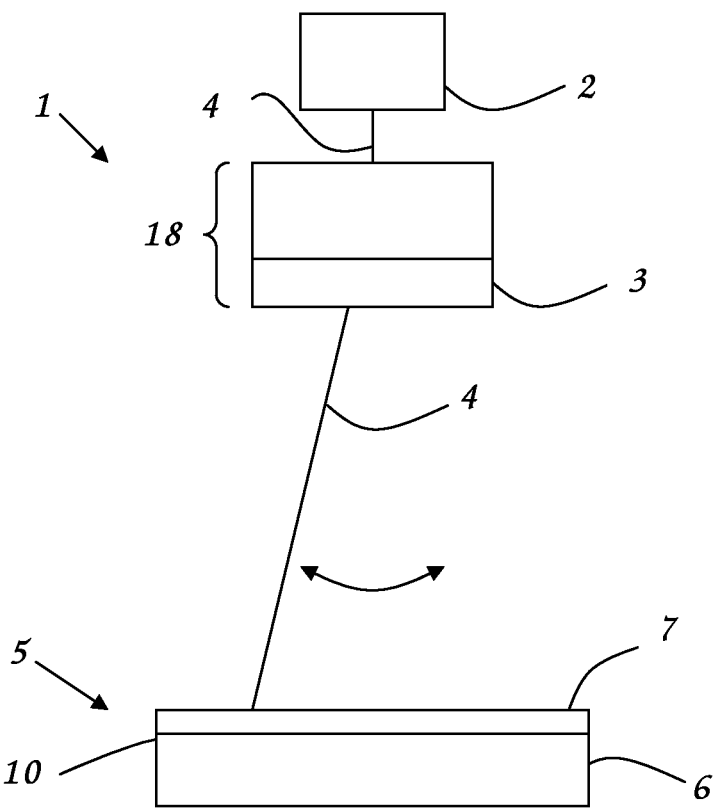

(51) Int. Cl.
 H01J 37/315 (2006.01)
 H01J 37/30 (2006.01)
 H01J 37/305 (2006.01)
 B23K 15/00 (2006.01)
 H01J 37/244 (2006.01)
 H01J 37/31 (2006.01)

(52) U.S. Cl.
 CPC ........... G21K 1/04 (2013.01); H01J 37/244 (2013.01); H01J 37/3007 (2013.01); H01J 37/3053 (2013.01); H01J 37/31 (2013.01); H01J 37/315 (2013.01); *H01J 2237/24514* (2013.01); *H01J 2237/24542* (2013.01); *H01J 2237/303* (2013.01)

(56) References Cited

U.S. PATENT DOCUMENTS

| | | | |
|---|---|---|---|
| 6,300,755 B1* | 10/2001 | Elmer | G01R 19/0061 324/464 |
| 6,353,231 B1* | 3/2002 | Golladay | H01J 37/244 250/397 |
| 6,977,382 B2 | 12/2005 | Loewer | |
| 7,288,772 B2* | 10/2007 | Elmer | H01J 37/315 250/305 |
| 7,348,568 B2 | 3/2008 | Elmer et al. | |
| 7,902,503 B2 | 3/2011 | Teruya et al. | |
| 8,471,203 B2 | 6/2013 | Benner et al. | |
| 2015/0129774 A1* | 5/2015 | McAninch et al. | G01R 19/0061 250/397 |

OTHER PUBLICATIONS

J. Fath et al.; Industrial Applications of Backscattered Electronis in Modern EB-Welding Machines, Proceedings of the 8th International Conference on Electron Beam Technologies, Varna (2006), 66-69.

E. Koleva et al.; Emittance Calculation Based on the Current Distribution Measurements at Changes of the Beam Focusing, Proceedings of the 8th International Conference on Electron Beam Technologies, Varna (2006), 51-65.

K. Friedel et al.; Measurements of beam emittance in electron beam welding. In: Welding International, 8 1994, 176-180.

S. Wojcicki et al.; A new method of experimental investigation of high-power electron beam. In: Vacuum, 58, 2000, 523-530.

* cited by examiner

METHOD FOR DETERMINING BEAM PARAMETERS OF A CHARGE CARRIER BEAM, MEASURING DEVICE, AND CHARGE CARRIER BEAM DEVICE

The invention relates to a method for determining beam parameters of a charge carrier beam, a measuring device according to the preamble of Claim 10, and a charge carrier beam apparatus according to the preamble of Claim 16.

A charge carrier beam, e.g. an electron beam, can be used for material processing, e.g. in welding and cutting processes, for drilling, eroding and in further forms of geometrical or metallurgical surface processing. In this case, the quality of the processing result is crucially dependent on the properties of the charge carrier beam. Therefore, there is great interest in being able to ascertain the properties of the charge carrier beam to be used with the highest possible accuracy. In particular, the beam geometry with intensity distribution, the beam caustic and the position of the focal point are of interest.

It is known (Reisgen, Uwe; Olschok, Simon; Backhaus, Alexander; "Diabeam: Ein vielseitiges Werkzeug zur Vermessung des Elektronenstrahls"; Im Blickpunkt—Deutschlands elite-Institute: Institut für Schweißtechnik and Fügetechnik der RWTH Aachen ["Diabeam: A versatile tool for measuring the electron beam"; In the spotlight—Germany's elite Institutes: Institute for Welding Technology and Joining Technology at RWTH Aachen]; pages 46-48; Institut für Wissenschaftliche Veröffentlichungen [Institute for Scientific Publications]; ISSN 1614-8185) to direct the charge carrier beam to be measured over a diaphragm apparatus onto a beam sensor. Accordingly, a slit diaphragm or a pinhole diaphragm can be used as the diaphragm.

If the charge carrier beam sweeps over the slit diaphragm, which is situated in a known position and orientation, transversely with respect to its longitudinal orientation, a one-dimensional measurement of the beam is made possible by means of the beam sensor. A rotational symmetry of the beam cross section is assumed for the complete characterization of the beam.

A more accurate measurement of the beam cross section is possible by means of the pinhole diaphragm. In this case, the charge carrier beam sweeps over the pinhole diaphragm line by line with, for example, 50 to 100 lines. With a pinhole diaphragm having a diameter of e.g. 20 µm, the beam cross section having a diameter of approximately 100-200 µm can be measured two-dimensionally in a highly accurate manner. In practice, however, striking the pinhole diaphragm with the charge carrier beam has proved to be problematic heretofore. Time-consuming adjustments carried out manually are established practice here.

Furthermore, diaphragm apparatuses are known (Dilthey, U.; Böhm, S.; Welters, T.; Rößler, K.; Manoharan, S.; Buvanashekaran G.; "Electron beam measurements with a diabeam system as a tool for the quality assurance", Proceedings: SOJOM 2000: Symposium on Joining of Materials, 20-22 Jan. 2000, Tiruchirappalli, India), which have two slit diaphragms parallel to one another, and additionally one pinhole diaphragm. One of the slit diaphragms is arranged in the beam centre axis of the undeflected electron beam above a beam sensor and is used for the actual one-dimensional beam parameter measurement. The second slit diaphragm serves to ascertain the deflection velocity of the electron beam oscillating over both slits. The pinhole sensor can be used for more accurate two-dimensional and more time-intensive ascertainment of the beam parameters. Slit diaphragm measurement and pinhole diaphragm measurement are independent of one another.

Furthermore, a diaphragm apparatus comprising two slit diaphragms parallel to one another and one pinhole diaphragm and also a method for diagnostically determining an electron beam are presented in greater detail in the paper "Electron beam diagnostics: A new release of the diabeam system" (U. Dilthey et al. Vacuum, 62 (2001), 77 to 85). No statements are made about automatic adjustment of the pinhole diaphragm.

U.S. Pat. No. 5,382,895 discloses a method for beam diagnosis by means of a slit diaphragm. In this case, the charge carrier beam is directed onto an individual slit and the charge beam passing through is ascertained. Afterwards, the slit is rotated and a renewed measurement is carried out. The intensity profile of the beam is determined from a multiplicity of individual measurements in a tomographic manner. The measuring system is adjusted manually in this case.

Furthermore, it is known (E. Koleva et al. "Emittance Calculation Based on the Current Distribution Measurements at Changes of the Beam Focusing", Proceedings at the 8th International Conference on Electron Beam Technologies, Varna (2006), 51-65), to use a diaphragm apparatus comprising two mutually perpendicular slit diaphragms for the purpose of beam characterization. In this case, two measurements are carried out, each proceeding with beam guidance perpendicularly to each of the two slit diaphragms. A pinhole diaphragm to be adjusted is not used.

Furthermore, it is known (U.S. Pat. No. 7,348,568) to use a diaphragm having slits extending radially in a rayed fashion, wherein the charge carrier beam is guided on a circular path perpendicularly to the slits. The evaluation of the individual measuring processes can likewise be carried out tomographically and result in an intensity profile of the beam. An adjustment of the measuring apparatus is not discussed.

For measuring the radial current distribution in an electron beam, it is furthermore known (S. Wójcicki et al.) to arrange two plates provided with slit diaphragms one behind the other in the beam direction. The slit diaphragms are rectilinear and at right angles to one another. Furthermore, each slit diaphragm is perpendicular to the movement carried out by the slit diaphragm during the measurement. The use of a pinhole diaphragm and the orientation thereof with respect to the beam are not discussed.

For measuring the emittance of an electron beam, it is known (K. Friedel et al.), to use a pinhole diaphragm upstream of a slit diaphragm in the beam direction. An automatic adjustment of the pinhole diaphragm in the electron beam is not discussed.

DE 102 32 0.230 A1 discloses a method for measuring the intensity profile of an electron beam, which also mentions an adjustment of an optical unit for an electron beam. In this case, the electron beam is directed onto a graphite plate and a current of backscattered electrons is measured by means of a sensor ring, arranged in the region of the deflection unit, in a manner dependent on the relative movement of electron beam and measuring structure. An adjusting process itself taking place before the beam measurement is not mentioned. Moreover, the charge carrier beam is not directed through a pinhole diaphragm or slit diaphragm onto the beam sensor.

DD 206 960 discloses a method for centring charge carrier beams, wherein a material block having a cross slot is used. The charge carrier beam impinges on said block in a manner sweeping over the slots of the cross slot in a circular movement. An electron backscatter current is detected by means of an annular trap. Said backscatter current is dependent on the position of the cross slot relative to the circle of the beam movement, as a result of which a centring can be ascertained.

DE 34 42 207 A1 discloses a device for identifying the impingement location of a charge carrier beam on a target. In this case, the x-rays emerging from the impingement location are identified by means of a detector, the signals of which are fed to an evaluation circuit. Said document discloses guiding the X-ray radiation through rectilinear slit diaphragms or through a pinhole diaphragm. A slit diaphragm for the charge carrier beam is not disclosed.

DE 26 34 341 A1 discloses the adjustment of a charge carrier beam relative to a butt joint during the welding process. A backscatter generated by an oscillating charge carrier beam is ascertained by means of two sensors, wherein the signal pattern depends on how the central path of the charge carrier beam is positioned with respect to the butt joint. The measurement result can be used to carry out a correction.

DD 226 428 A1 discloses a device for setting an electron probe by means of a masked electron detector. The mask (diaphragm) has a plurality of square openings. The electron beam is guided in the shape of a cross and passes through the opening onto a beam sensor. A possibility of determining the focal spot-related and deflection-related parameters of the electron beam apparatus arises from the relative position of the cross figure formed by the electron beam in relation to the opening respectively irradiated.

An automatic beam adjustment is furthermore disclosed by E. Koleva et al. (E. Koleva et al., Emittance Calculation Based on the Current Distribution Measurements at Changes of the Beam Focusing, Proceedings of the 8$^{th}$ International Conference on Electron. Beam Technologies, Varna (2006), 51-65), which firstly discloses generating an electron-optical image of the workpiece to be welded, and determining the position and orientation of the workpiece by means of image processing and using them as a basis for CNC control. Furthermore, for automatic beam orientation for the welding process, said document proposes measuring the electron beam on a sensor with changing focal lengths of the objective lens. Said document proposes the steps of focusing, then firstly coarse centring and coarse stigmatisation and subsequently more accurate centring and more accurate stigmatisation. The use of pinhole or slit diaphragms and the automatic orientation of the pinhole diaphragm with respect to the electron beam are not discussed.

The invention addresses the technical problem of providing a method for determining beam parameters of a charge carrier beam, a measuring device and a charge carrier beam apparatus of the type mentioned in the introduction which makes possible an alternative automatic self-adjustment of a measurement diaphragm in comparison with the prior art.

In the case of a method for determining beam parameters of a charge carrier beam, the technical problem is solved by means of the features of Claim 1. Preferred embodiments of this method are evident from dependent Claims 2 to 9.

In the case of a measuring device of the type mentioned in the introduction that is suitable for use in the abovementioned method, the technical problem is solved by means of the characterizing features of Claim 10. Advantageous embodiments of the measuring device according to the invention are defined in Claims 11 to 15.

In the case of a charge carrier beam apparatus of the type mentioned in the introduction, the technical problem is solved by means of the characterizing feature of Claim 16. An advantageous embodiment of the charge carrier beam apparatus according to the invention is evident from Claim 17.

The method according to the invention for determining beam parameters of a charge carrier beam uses a diaphragm apparatus comprising both a measurement diaphragm, e.g. in the form of a pinhole diaphragm, and a slit diaphragm arrangement having one or a plurality of slit diaphragms. The slit diaphragms serve to ascertain, with the aid of the charge carrier beam, the position of the diaphragm apparatus in relation to a measurement plane, defined by a beam sensor, relative to a measurement reference point.

The measurement reference point is preferably that location in the measurement plane in which the beam parameters are measured later by means of the measurement diaphragm. In general, the point of intersection of the beam centre axis of the undeflected charge carrier beam with the measurement plane is used for this purpose. Beam parameter measurements can also be expedient at other measurement reference points, e.g. in order to determine the dependence of the beam parameters on the deflection angle of the charge carrier beam.

If the position of the diaphragm apparatus relative to the measurement reference point can be ascertained unambiguously, the measurement diaphragm with the diaphragm apparatus can be positioned accurately above the measurement reference point automatically and in a machine-controlled manner, in order subsequently to carry out the beam parameter measurement. Consequently, the measurement diaphragm can be adjusted fully automatically for the beam parameter measurement, as a result of which the generally more time-consuming manual adjustment act known in the prior art can be omitted.

In order to determine the position of the diaphragm apparatus relative to the measurement reference point, the charge carrier beam is guided over the slit diaphragm arrangement once or multiply depending on the geometry and/or position of the slit diaphragm arrangement, wherein the measurement plane coordinates of beam impingement locations of the beam portions of the charge carrier beam which impinge on the measurement plane through the slit diaphragm arrangement are detected. Depending on the geometry of the slit diaphragm arrangement, three beam impingement locations can suffice to unambiguously define the position of the diaphragm apparatus relative to the measurement reference point.

The required number of beam impingement locations can be achieved, given a suitable geometry, by means of the charge carrier beam sweeping over the slit diaphragm arrangement once.

Within the meaning of the invention concerned here, the expressions of the charge carrier beam sweeping over the slit diaphragm arrangement once or the charge carrier beam being guided over the slit diaphragm arrangement once encompass both the movement of the charge carrier beam once over the slit diaphragm arrangement in one direction and the oscillating movement, provided that the orientation of the oscillation movement relative to the slit diaphragm arrangement is not changed.

Sweeping over the slit diaphragm arrangement once or in an oscillating manner preferably takes place rectilinearly.

The method according to the invention can also be carried out in such a way that, in order to generate a sufficient number of beam impingement locations, the charge carrier beam is guided over the slit diaphragm arrangement multiply in different orientations or positions relative to said slit diaphragm arrangement, e.g. because otherwise the number of beam impingement locations is not sufficient.

The method according to the invention can also be carried out in such a way that the charge carrier beam is guided over the slit diaphragm arrangement in two mutually independent deflection directions of the deflection unit. The deflection unit of a charge carrier beam apparatus has, for two different, preferably mutually perpendicular, deflection directions, dedicated deflection elements, e.g. inductive elements, such as coils, for generating a respective magnetic field or elements generating a respective electric field, e.g. plate capacitors. The two deflection directions can be chosen, for example, parallel to the X-axis and to the Y-axis of a Cartesian coordinate system. If the charge carrier beam is guided over the slit diaphragm arrangement firstly in the first direction (e.g. x-direction), and then in the direction perpendicular thereto (y-direction), in each case one deflection element is not active, that is to say that e.g. the coil is deenergised. Upon sweeping over the diaphragm apparatus in the x-direction, the beam impingement locations found thus have, as y-component, that of the undeflected charge carrier beam. Upon sweeping over the diaphragm apparatus in the y-direction, the x-coordinate of the undeflected charge carrier beam correspondingly arises. The point of intersection of the beam centre axis of the undeflected charge carrier beam with the measurement plane can be determined automatically in this way. The point of intersection of the beam centre axis of the undeflected charge carrier beam with the measurement plane can be defined as the origin of the Cartesian coordinate system.

In order to obtain a sufficient number of beam impingement locations, the method according to the invention can also be performed in such a way that the position and/or the orientation of the diaphragm apparatus relative to the measurement plane are/is altered in a defined manner at least once, and, in at least two different positions and/or orientations of the diaphragm apparatus, the charge carrier beam is guided over the slit diaphragm arrangement in an oscillating or non-oscillating manner and the measurement plane coordinates of at least one beam impingement location are detected. The interim alteration of the position and/or the orientation of the diaphragm apparatus makes it necessary to take account of the resultant movement information as further data for determining control data for moving the measurement diaphragm into the position above the measurement reference point. The alteration of the position and/or orientation of the diaphragm apparatus can be carried out by means of a translational movement and/or a rotational movement about an axis perpendicular to the measurement plane.

The method according to the invention can also be performed in such a way that the detected measurement plane coordinates of the beam impingement locations are used for determining at least one calibration value of the beam deflection unit. For this purpose, at the point in time at which the charge carrier beam strikes the slit diaphragm and the measurement plane coordinates of the corresponding beam impingement location are ascertained, a relevant controlled variable for the active deflection element of the deflection unit, e.g. the current of a deflection coil or the voltage of an element generating an electric field, is detected. Given a known point of intersection of the beam centre axis of the undeflected charge carrier beam, the calibration value arises directly, i.e. an unambiguous relationship between the deflection of the charge carrier beam, e.g. measured in angular units with respect to the undeflected beam centre axis or in distance units on the measurement plane, and the deflection controlled variable, e.g. the current in the coil or the voltage in an element generating an electric deflection field.

In the manner explained, therefore, the calibration value of a charge carrier beam apparatus can also be ascertained independently of a later measurement at the measurement diaphragm.

The method according to the invention can also be performed in such a way that, for the purpose of checking further beam parameters, in particular an angular deviation of the charge carrier beam directed onto the measurement reference point, and/or the focal position, the measurement diaphragm is moved with a component perpendicular to the measurement plane. In the case of the measurement on the undeflected charge carrier beam, the diaphragm apparatus is moved in the z-direction, that is to say perpendicularly to the measurement plane. For the movement in the z-direction, the measurement diaphragm can be moved jointly with the beam sensor. However, it is also conceivable to move the measurement diaphragm relative to the beam sensor.

Furthermore, it can be advantageous to use the beam parameters determined by means of the measurement for a control or regulation of the charge carrier beam apparatus. The beam parameters determined can be fed back e.g. into the control for a beam generating unit of the charge carrier beam apparatus, e.g. for controlling the voltage used or for manipulating the position of a charge carrier emitter, e.g. an incandescent filament. The beam parameters determined can also be used for the control or regulation of the beam guiding and/or beam shaping, e.g. for a focusing unit, an adjusting unit, the deflection unit and/or a stigmator. By way of example, beam adjustment and beam stigmatisation can be carried out automatically on the basis of stored characteristic curves.

Different geometries which allow the automatic adjustment explained are conceivable for the slit diaphragm arrangement. In this regard, two non-parallel slit diaphragm sections lying alongside one another with an expedient longitudinal extent can suffice. Different slit diaphragm sections can belong to a common slit diaphragm, e.g. having a meandering course, or else two separate slit diaphragms.

However, it can also be advantageous to provide a self-contained or largely closed slit diaphragm, e.g. in the shape of a triangle. The closed, i.e. endless slit diaphragm increases the probability that a charge carrier beam guided over the slit diaphragm will strike the slit of the slit diaphragm twice.

One particularly preferred embodiment of the measuring device comprises a diaphragm apparatus having a closed circular slit diaphragm as the slit diaphragm arrangement. This rotationally symmetrical slit diaphragm allows a particularly simple calculation of the position and arrangement of the diaphragm apparatus relative to the measurement plane.

Alternatively, it is also possible to provide slit diaphragms which are closed or open in a semicircular fashion or in a largely circular fashion with interruption(s) of the diaphragm slit.

Temperature monitoring can also be integrated in a measuring device. It is thereby possible for measurement errors which result from thermal expansion of the apparatus to be corrected computationally by means of the known material characteristic values. Moreover, damage to the measuring apparatus can be prevented by temperature monitoring.

The beam sensor covered by the diaphragm apparatus can be protected against contamination when not in operation by means of a protective shutter arranged on the measuring device. The sensor protected in this way, in particular, can remain permanently in a charge carrier apparatus, which can increase the reproducibility and accuracy of measurement results and enables effective use as a quality assurance measure. The protective shutter can be machine-controlled.

Furthermore, it can be advantageous to provide for the measuring device a dedicated deflection unit suitable for the charge carrier beam. Said dedicated deflection unit of the measuring device can be fixed relative to the charge carrier apparatus and control the charge carrier beam thereof independently of the deflection unit of the charge carrier apparatus. Thus, the same measuring device according to the invention can be used autonomously on different charge carrier apparatuses. The deflection unit of the charge carrier apparatus need not be linked in and can remain deactivated during the beam parameter measurement.

One exemplary embodiment of a method according to the invention for determining beam parameters of a charge carrier beam and one preferred embodiment of the measuring device according to the invention are explained below with reference to schematic figures.

Figure 2:
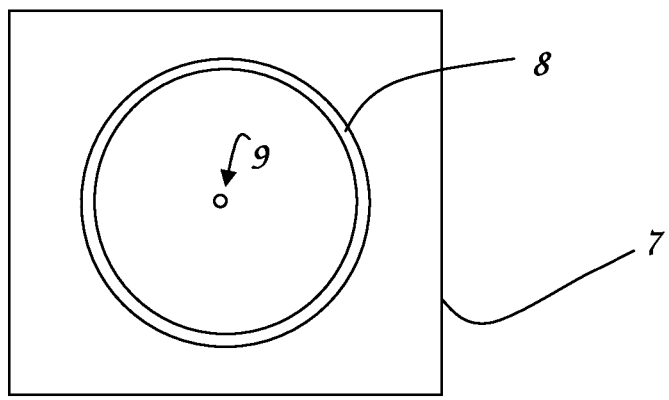
Figure 3:
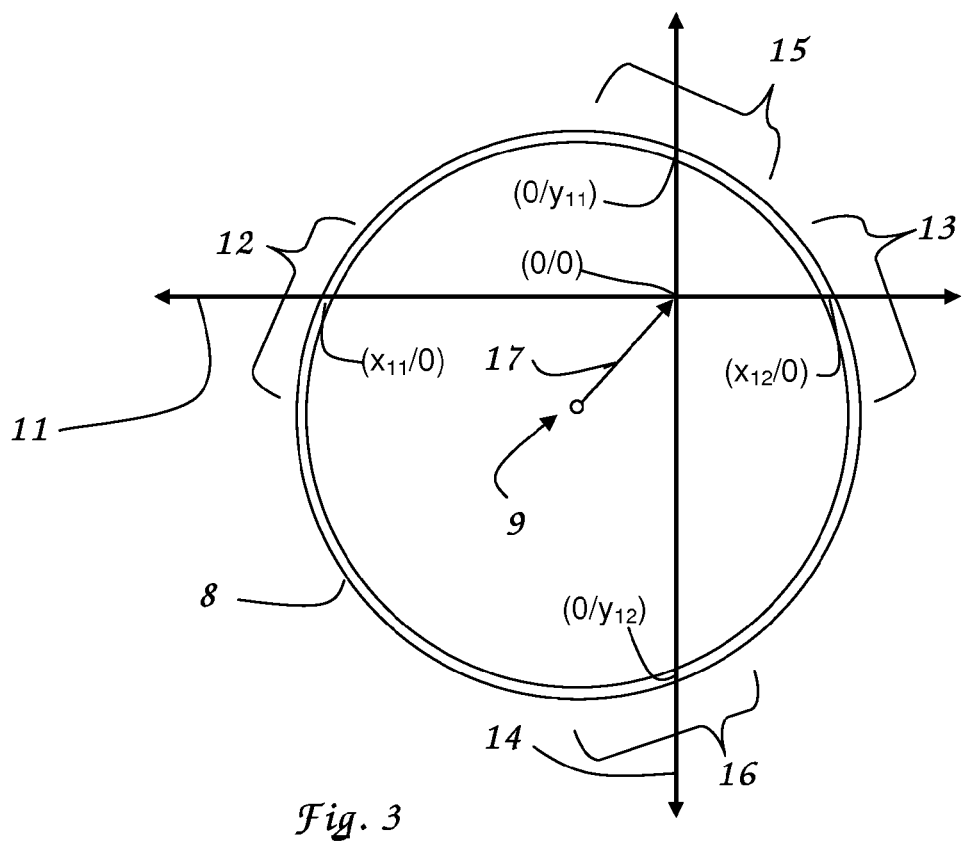
Figure 4:
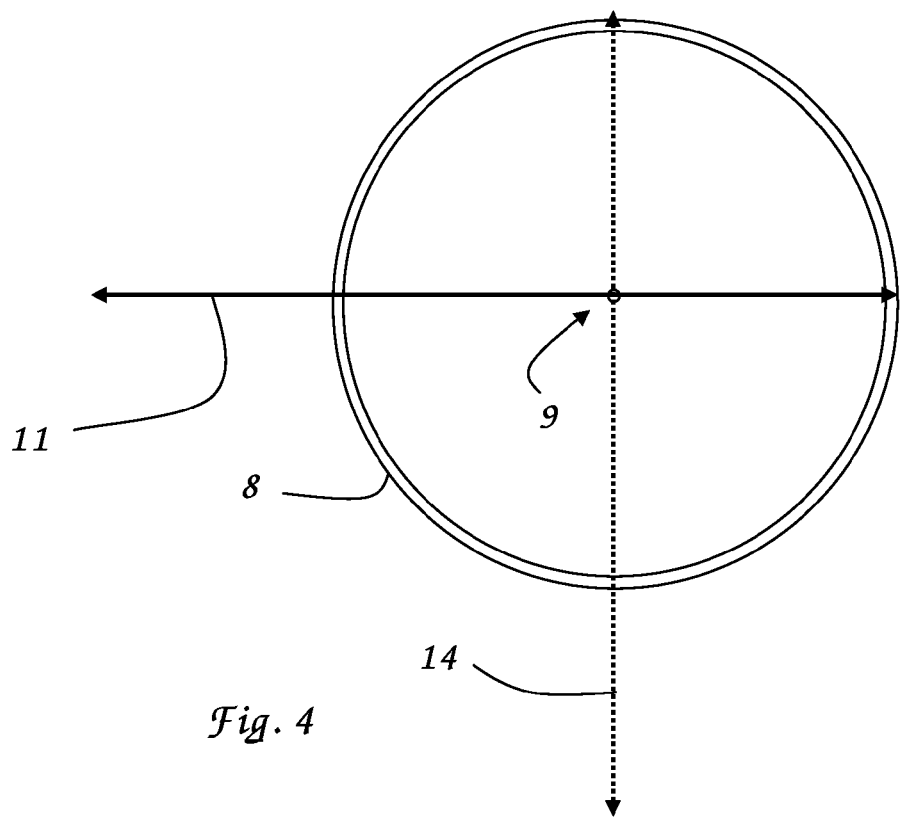

In the figures, schematically:

FIG. 1 shows an electron beam installation with measuring device for ascertaining beam parameters, FIG. 2 shows a diaphragm apparatus, FIG. 3 shows a circular slit diaphragm in an initial position relative to a measurement reference point, and FIG. 4 shows the slit diaphragm in accordance with FIG. 3 in a measurement position.

FIG. 1 shows an electron beam installation 1 comprising an electron beam generator unit 2 and a beam manipulation unit 18 for beam guiding and beam shaping. The beam manipulation unit 18 includes a deflection unit 3, which deflects an electron beam 4 from a beam centre axis of the undeflected electron beam 4. The beam manipulation unit 18 can additionally include devices (not illustrated here) for focusing, adjustment and stigmatisation. The deflection unit 3, which is merely illustrated schematically here, is realised e.g. by deflection coil elements (not illustrated separately here), wherein respectively one deflection coil element is used for one of two independent deflection directions (parallel to an x-axis and parallel to a y-axis of a Cartesian coordinate system). The deflection coil elements, in each case by means of a defined current input, generate a magnetic field that deflects the electron beam 4.

A measuring device 5 comprising a beam sensor 6 and a diaphragm apparatus 7 is used for ascertaining beam parameters of the electron beam 4. The beam sensor defines a measurement plane 10, on which electrons of the electron beam 4 that passed through the diaphragm apparatus 7 impinge. The diaphragm apparatus 7 is illustrated schematically in plan view in FIG. 2 and has a circular slit diaphragm 8 and a pinhole diaphragm 9 arranged concentrically with respect to the slit diaphragm 8.

For determining the beam parameters, e.g. the distribution of the intensity in the beam cross section, the pinhole diaphragm 9 is used in a known manner by means of the electron beam 4 being guided line by line over the pinhole diaphragm 9.

Before the beam parameter measurement can be carried out by means of the pinhole diaphragm 9, the pinhole diaphragm 9, which firstly has an initial position that is not suitable for the beam parameter measurement, has to be adjusted relative to the electron beam 4, that is to say brought into a measurement position. The latter is preferably situated exactly in the beam centre axis of the undeflected electron beam 4. The point of intersection of the beam centre axis of the undeflected electron beam 4 with the measurement plane 10 is referred to hereinafter as the measurement reference point.

In order to be able to determine the initial position of the pinhole diaphragm 9 relative to its measurement position, firstly the electron beam 4 is oscillated over the slit diaphragm 8 in a defined manner. This procedure is explained in greater detail in FIG. 3. Firstly, the electron beam 4 is oscillated over the slit diaphragm 8 solely by means of one of the deflection coil elements not illustrated here, e.g. in the x-direction. In FIG. 3, a double-headed arrow symbolizes the first beam trace 11 of the electron beam 4 (not illustrated in FIG. 3), said first beam trace being provided in the measurement plane 10 (see FIG. 1) or on the diaphragm apparatus 7. In the direction perpendicular thereto (the y-direction in the example), the electron beam 4 remains undeflected.

The measuring device 5 is positioned in such a way that the oscillating electron beam 4 sweeps over the slit diaphragm 8 at two different slit diaphragm sections 12 and 13. In the measurement plane 10 situated below the diaphragm apparatus 7, beam portions passing through the slit diaphragm 8 impinge in beam impingement locations whose coordinates in the measurement plane 10 are detected. If the measurement reference point is defined as the origin of the Cartesian coordinate system, $(x_{11}/0)$ arises below the slit diaphragm section 12 and $(x_{12}/0)$ arises below the slit diaphragm section 13 as measurement plane coordinates of the beam impingement location there. These measurement plane coordinates are entered in FIG. 3, disregarding displacements on account of the distance between the diaphragm apparatus 7 and the measurement plane 10 (see FIG. 1).

The electron beam 4 is subsequently oscillated without deflection in the x-direction along the y-axis, which is symbolized by means of a further double-headed arrow as beam trace 14 in FIG. 3. In this case, the electron beam 4 sweeps over the slit diaphragm 8 in the slit diaphragm sections 15 and 16, which leads to beam impingement locations having the measurement plane coordinates $(0/y_{11})$ and $(0/y_{12})$ in the measurement plane 10.

Even with three of the abovementioned measurement plane coordinates, the position of the circular slit diaphragm 8, the diameter of which is known, is unambiguously defined relative to the point of intersection (0/0), of the beam centre axis of the undeflected electron beam 4. The detection of the measurement plane coordinates of the fourth beam impingement location can thus be dispensed with. The position of the pinhole diaphragm 9, which is arranged at the centre point of the circle defined by the slit diaphragm 8, relative to the measurement reference point (0/0) is thus defined as well. Consequently, by means of simple geometrical calculations, a travel path 17 for the measuring device 7 can be determined, with which travel path the pinhole diaphragm 9 is to be positioned exactly above the measurement reference point (0/0) in a machine-controlled manner. The situation with a correspondingly moved pinhole diaphragm 9 is illustrated in FIG. 4. In the given position of the pinhole diaphragm 9, the beam parameter measurement can then be carried out, in the course of which the electron beam is guided over the pinhole diaphragm 9 in numerous lines, e.g. in the x-direction.

While the position of the diaphragm apparatus 7 relative to the measurement reference point (0/0) is determined in accordance with FIG. 3, the calibration values of the deflection unit 3 can be ascertained at the same time. For this purpose, in each case at the point in time at which the electron beam 4 passes through the slit, diaphragm 8 onto the measurement plane 10, the respectively responsible control variable for that deflection coil element of the deflection unit 3 which is responsible for the oscillation movement is noted, e.g. the current used. In principle, respectively one of the pairs of coordinates that can be determined on the beam trace 11 or 14 suffices for this purpose.

If the measuring apparatus 7 is positioned during the measurement in accordance with FIG. 3 in such a way that the beam traces 11 and 14 sweep over the slit diaphragm 8 fewer than three times, the measuring apparatus 7 is moved by an intermediate distance in a defined manner in order subsequently to carry out a further measurement with the beam trace 11 and/or the beam trace 14. In this case, the intermediate distance should be included for determining the travel path 17 of the pinhole diaphragm 9 with respect to the measurement reference point.

The vertical distance between diaphragm apparatus 7 and measurement plane 10 was disregarded in the above consideration. Said vertical distance should be concomitantly included computationally, if appropriate.

LIST OF REFERENCE SIGNS

1 Electron beam installation
2 Electron beam generator unit
3 Deflection unit
4 Electron beam
5 Measuring device
6 Beam sensor
7 Diaphragm apparatus
8 Slit diaphragm
9 Pinhole diaphragm
10 Measurement plane
11 First beam trace (x-direction)
12 Slit diaphragm section
13 Slit diaphragm section
14 Second beam trace (y-direction)
15 Slit diaphragm section
16 Slit diaphragm section
17 Travel path to the measurement position
18 Beam manipulation unit

The invention claimed is:

1. A method for determining beam parameters of a charge carrier beam (4), wherein
    a) the charge carrier beam (4) of a charge carrier beam apparatus (1) is guided by means of a beam deflection unit (3) over a slit diaphragm arrangement having at least one slit diaphragm (8), which is provided in a diaphragm apparatus (7),
    b) by means of a beam sensor (6) defining a measurement plane (10), measurement plane coordinates of beam impingement locations of beam portions that passed through said slit diaphragm arrangement are detected,
    c) a measurement diaphragm (9) arranged in said diaphragm apparatus (7) and constructed as a pinhole diaphragm is automatically moved into a position above a measurement reference point given in said measurement plane (10), wherein said measurement plane coordinates of said beam impingement locations are processed on the basis of the known geometrical arrangement of said at least one slit diaphragm (8) and said measurement diaphragm (9) on said diaphragm apparatus (7) for the purpose of determining control data for the movement of said measurement diaphragm (9), and
    d) said charge carrier beam (4) is guided, for the purpose of beam parameter measurement, over said measurement diaphragm (9) moved in accordance with feature c).

2. The method according to claim 1, characterized in that, for the purpose of carrying out the method step according to feature a) of claim 1, said charge carrier beam (4) is guided multiply over said slit diaphragm arrangement.

3. A method according to claim 2, characterized in that for the purpose of carrying out the method step according to feature a) of claim 1, said charge carrier beam (4) is guided over said slit diaphragm arrangement in two mutually independent deflection directions of said deflection unit (3).

4. A method according to claim 1, characterized in that, for the purpose of carrying out the method step according to feature a) of claim 1, said charge carrier beam (4) is guided over said slit diaphragm arrangement in an oscillating manner.

5. A method according to claim 1, characterized in that the impingement point of the undeflected charge carrier beam (4) on said measurement plane (10) is chosen as said measurement reference point.

6. A method according to claim 1, characterized in that the position and/or the orientation of said diaphragm apparatus (7) relative to said measurement plane (10) are/is altered in a defined manner at least once, the method steps according to claim 1 features a) and b) are carried out in at least two different positions and/or orientations of said diaphragm apparatus (7) and the alteration of the position and/or the orientation of said diaphragm apparatus (7) is processed as further data for the purpose of determining control data for the movement of said measurement diaphragm (9) according to method step c) of claim 1.

7. A method according to claim 1, characterized in that at least one calibration value of said beam deflection unit (3) is determined with the processing of the measurement plane coordinates of the beam impingement locations as detected in feature (b) of claim 1.

8. A method according to claim 1, characterized in that, for the purpose of checking further beam parameters, in particular an angular deviation of said charge carrier beam (4) directed onto said beam reference point, and/or the focal position, said measurement diaphragm (9) is moved with a component perpendicular to said measurement plane (10).

9. A method according to claim 1, characterized in that the beam parameters determined are fed back for a control or regulation of said charge carrier beam apparatus (1).

10. A measuring device (5) for measuring beam parameters suitable for use in a method according to claim 1, said measuring device comprising a beam sensor (6) and a diaphragm apparatus (7), wherein said diaphragm apparatus (7) has a slit diaphragm arrangement and a measurement diaphragm (9) and wherein said measurement diaphragm is a pinhole diaphragm, characterized in that said slit diaphragm arrangement comprises at least two slit diaphragm sections (12, 13, 15, 16) which are not parallel to one another.

11. The measuring device claimed in claim 10, characterized in that at least two of said slit diaphragm sections (12, 13, 15, 16) belong to an individual continuous slit diaphragm (8).

12. The measuring device claimed in claim 10, characterized in that said slit diaphragm arrangement comprises a self-contained endless slit diaphragm (8).

13. The measuring device claimed in claim 10, characterized in that at least one slit diaphragm (8) is circular at least in sections.

14. The measuring device claimed in claim 10, further comprising a protective shutter for temporarily closing off said slit diaphragm arrangement and said measurement diaphragm (9).

15. The measuring device claimed in claim 10, further comprising a dedicated deflection unit for said charge carrier beam (4).

16. The charge carrier beam apparatus claimed in claim 10, for carrying out the method recited in claim 1, said charge carrier beam apparatus further comprising a charge carrier beam source (2) and a beam deflection unit (3).

17. The charge carrier beam apparatus claimed in claim 11, for carrying out the method recited in claim 1, said charge carrier beam apparatus further comprising a charge carrier beam source (2) and a beam deflection unit (3).

18. The charge carrier beam apparatus claimed in claim 12, for carrying out the method recited in claim 1, said charge carrier beam apparatus further comprising a charge carrier beam source (2) and a beam deflection unit (3).

19. The charge carrier beam apparatus claimed in claim 13, for carrying out the method recited in claim 1, said charge carrier beam further comprising a charge carrier beam source (2) and a beam deflection unit (3).

20. The charge carrier beam apparatus claimed in claim 16, further comprising for feeding back measurement results of said measuring device (5) for the control of said charge carrier beam apparatus (1).

* * * * *